United States Patent
Tsai et al.

(10) Patent No.: US 7,175,709 B2
(45) Date of Patent: Feb. 13, 2007

(54) EPITAXY LAYER AND METHOD OF FORMING THE SAME

(75) Inventors: Pang-Yen Tsai, Chupei (TW); Liang-Gi Yao, Hsinchu (TW); Chun-Chieh Lin, Taichung (TW); Wen-Chin Lee, Hsinchu (TW); Shih-Chang Chen, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/847,099

(22) Filed: May 17, 2004

(65) Prior Publication Data
US 2005/0252443 A1    Nov. 17, 2005

(51) Int. Cl.
C30B 25/04    (2006.01)

(52) U.S. Cl. ............... 117/86; 117/94; 117/95; 117/101; 117/104

(58) Field of Classification Search ............. 117/86, 117/94, 95, 101, 104
See application file for complete search history.

(56) References Cited

U.S. PATENT DOCUMENTS

| | | | | |
|---|---|---|---|---|
| 4,052,782 A * | 10/1977 | Weinstein et al. | ............ | 438/64 |
| 5,634,973 A * | 6/1997 | Cabral et al. | ........... | 117/95 |
| 6,136,628 A * | 10/2000 | Sugiyama | ........... | 438/48 |
| 6,218,711 B1 | 4/2001 | Yu | ........... | 257/384 |
| 6,479,358 B1 | 11/2002 | Yu | ........... | 438/300 |
| 6,492,216 B1 | 12/2002 | Yeo et al. | ........... | 438/197 |
| 2002/0079551 A1* | 6/2002 | Hokazono | ........... | 257/486 |
| 2002/0153808 A1* | 10/2002 | Skotnicki et al. | ........... | 310/328 |
| 2002/0185053 A1* | 12/2002 | Fei et al. | ........... | 117/2 |
| 2003/0166323 A1* | 9/2003 | Vietzke et al. | ........... | 438/299 |
| 2004/0043576 A1* | 3/2004 | Shideler et al. | ........... | 438/312 |

OTHER PUBLICATIONS

Li et al. "Wavy interface morphologies in strained SiGe/Si multilayers on vicinal Si (111) substrates", Journal of Physics Condense Matter vol. 10, 1998 pp. 8643-8652.*

* cited by examiner

Primary Examiner—Robert Kunemund
(74) Attorney, Agent, or Firm—Thomas, Kayden, Horstemeyer & Risley

(57) ABSTRACT

A method of forming an epitaxial layer of uniform thickness is provided to improve surface flatness. A substrate is first provided and a Si base layer is then formed on the substrate by epitaxy. A Si—Ge layer containing 5 to 10% germanium is formed on the Si base layer by epitaxy to normalize the overall thickness of the Si base layer and the Si—Ge layer containing 5 to 10% germanium.

12 Claims, 7 Drawing Sheets

EPITAXY LAYER AND METHOD OF FORMING THE SAME

BACKGROUND

The present invention relates to a semiconductor manufacturing process and in particular to a method of forming an epitaxy layer of uniform and flat surface.

Currently, deep-submicron complementary metal oxide semiconductor (CMOS) is the primary technology for ultra-large scale integrated (ULSI) devices. Over the last two decades, reducing the size of CMOS transistors and increasing the number of transistors on chip have held principal focus in the microelectronics industry. An ultra-large scale integrated circuit can include over 1 million transistors.

The ULSI circuit can include CMOS field effect transistors (FETS) with semiconductor gates disposed between drain and source regions. The drain and source regions are typically heavily doped with a P-type dopant (boron) or an N-type dopant (phosphorous). The drain and source regions generally include a thin extension disposed partially underneath the gate to enhance the transistor performance. Shallow source and drain extensions help to achieve immunity to short-channel effects that degrade transistor performance for both N-channel and P-channel transistors. Short-channel effects can cause threshold voltage roll-off and drain-induced barrier-lowering. Shallow source and drain extensions and, therefore controlling short-channel effects, are particularly important as transistors become smaller.

As the size of transistors disposed on ICs decreases, transistors with shallow and ultra-shallow source/drain extensions become more difficult to manufacture. For example, a small transistor may require ultra-shallow source and drain extensions with less than 30 nanometer (nm) junction depth. The source and drain junction depths also scale with the junction depth of source and drain extensions. During subsequent silicidation process on the source and drain extensions, silicide may penetrate the source and drain junctions, resulting in junction leakage issue. Raised source and drain, therefore, is now introduced to improve junction leakage by forming additional Si on the source/drain regions in the substrate for silicidation consumption. Similarly, raised source and drain is also utilized for silicon-on-insulator (SOI) application. Typical silicon thickness on the oxide layer is 100~200 Å for fully depleted SOI structure. Silicidation process may consume all of the silicon above the oxide layer if without raised source and drain.

The raised source and drain regions are conventional formed by dpositing epitaxial silicon on the source and drain regions in the substrate. The raised source and drain regions provide additional material for contact silicidation processes and reduce junction leakage. In the conventional art, shallow source and drain extensions are first formed in a substrate. Pure silicon (Si) selective epitaxy growth (SEG) is then performed to form an elevated source and an elevated drain, i.e. raised source and drain.

Furthermore, conventional technology also uses Silicon Germanium (SiGe) selective epitaxy growth (SEG) to form raised source/drain regions. This process can be performed at lower temperature than that used in pure Si selective epitaxy growth for thermal budget reduction considerations. However, silicon germanium (SiGe) selective epitaxy growth (SEG), makes silicidation of the raised extensions difficult. Yu, in U.S. Pat. Nos. 6,218,711 and 6,479,358, the entirety of each of which are hereby incorporated by reference, describes a raised source/drain process by epitaxy, using a method of forming a raised source/drain comprising germanium of gradient concentration to overcome difficulty of silicidation.

Furthermore, epitaxial layers are also utilized for other applications. For example, Yeo et al., in U.S. Pat. No. 6,492,216, the entirety of which is hereby incorporated by reference, describes a method of forming a tensile or compressive strained channel region for a semiconductor device, such as a MOSFET device, allowing improved carrier transport properties and increased device performance to be realized. The strained channel layer composed of silicon-germanium-carbon layer is formed utilizing ultra high vacuum chemical vapor deposition (UHVCVD).

SUMMARY

The present invention overcomes the shortcomings associated with the background art and achieves other advantages not realized by the background art.

An object of the present invention is to form an epitaxial layer with uniform thickness and a flat surface, thus benefiting subsequent processing.

These or other objects are accomplished by forming a Si—Ge layer containing 5–10% germanium by epitaxy on a base layer, which forms a very flat surface and therefore normalize an overall thickness of the base layer and the Si—Ge layer with 5–10% germanium. According to one aspect of the invention, raised sources and drains with uniform thickness and flat surfaces can be formed by introducing an epitaxial Si—Ge layer with 5–10% germanium on the source and drain regions in a semiconductor substrate. The preferred thickness of the epitaxial Si—Ge layer containing 5–10% germanium for raised source and drain is about 50–1000 Å. The epitaxial Si—Ge layer with 5–10% germanium can be used alone or disposed on a Si base layer. The film stack can maintain a uniform thickness with the epitaxial Si—Ge layer with 5–10% germanium.

Another application includes a high Ge concentration bottom layer, e.g. ~20~30% Ge. The thickness of the high Ge layer would be non-uniform due to surface tension. The epitaxial Si—Ge layer with 5–10% germanium of this invention can be grown on the top of the high Ge layer, thereby achieving a uniform thickness of the laminated layer.

In another aspect of the invention, a method of forming a Si—Ge layer with uniform thickness and a flat surface is provided. First, a substrate is provided. Next, a Si—Ge layer is formed on the substrate by epitaxy, containing 5–10% germanium, and preferably 5–8%. The Si—Ge layer can be formed on a Si-based epitaxial layer comprising elements from the IVA group of the periodic table, such as carbon. More specifically, the Si—Ge layer containing 5–10% germanium can be formed by using selective epitaxy growth (SEG), and the precursor may comprise $SiH_2Cl_2$ and $GeH_4$. The uniform epitaxial Si—Ge layer containing 5–10% germanium can be utilized for specific applications, such as raised source drain, strained channel, and BiCMOS, for providing a flat and uniform surface.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DESCRIPTION

It is noted that the description herein below refers to various layers arranged on, above or overlying other layers, to describe the relative positions of the various layers. References to "on", "above", "overlying", or other similar languages, are not limited to the interpretation of one layer being immediately adjacent another layer. There may be intermediate or interposing layers, coatings, or other structures present, and associated process steps present, which are not shown or discussed herein, but could be included without departing from the scope and spirit of the invention disclosed herein. Similar, references to structures adjacent, between or other positional references to other structures merely describe the relative positions of the structures, with or without intermediate structures.

The present invention will hereinafter be described with reference to the accompanying drawings. FIGS. 1A to 1F illustrate some epitaxial layers formed according to the present invention.

As shown in FIGS. 1A to 1F, the present invention provides a flat and uniform surface of an epitaxial layer by forming an epitaxial Si—Ge layer containing 5–10% germanium, and more preferably, containing 5–8% germanium. The critical germanium content, i.e. an epitaxial $Si_{1-x}Ge_x$ layer with $x=0.05\sim0.1$, provides a great surface topography control and overall thickness uniformity, no matter disposed on a flat surface or on a non-uniform epi-layer. In addition, it is found that the surface of the epitaxial Si—Ge layer becomes wavy if the Ge content exceeds 10% according to the invention.

Figure 1A:
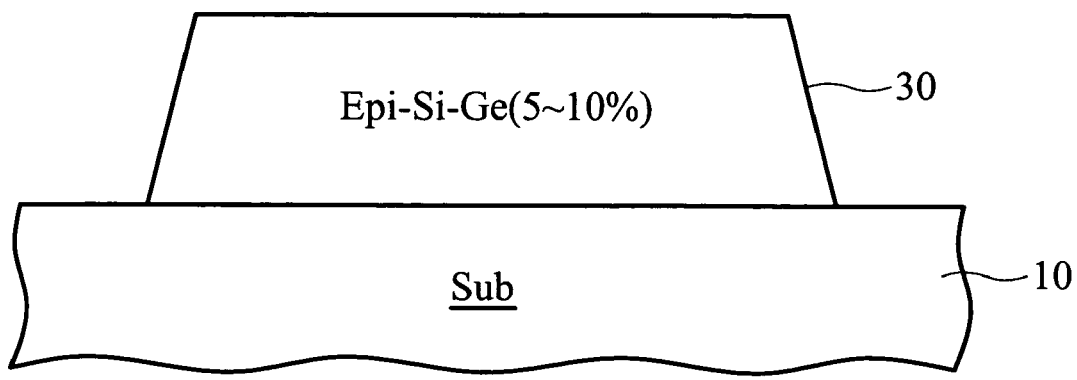
FIGS. 1A to 1F are epitaxial layers according to some embodiments of the present invention.

According to one embodiment of the invention, FIG. 1A shows an epitaxial Si—Ge layer 30 containing 5–10% germanium is directly formed on a flat substrate 10, e.g. a silicon substrate, with a uniform thickness and flat top surface.

Figure 1B:
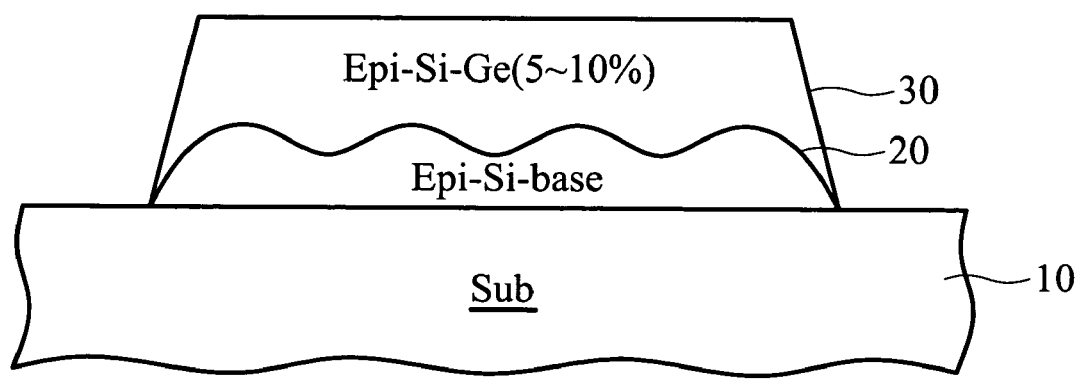

FIG. 1B shows an epitaxial layer stack according to another embodiment of the invention. An epitaxial silicon base layer 20 is formed on a flat substrate 10, e.g. a wafer or a silicon-on-insulator substrate, with a wavy topography. An epitaxial Si—Ge layer 30 containing 5–10% germanium is then formed on the epitaxial silicon base layer 20 to normalize the overall thickness of the epitaxial layers 20 and 30, thereby providing a flat surface of the epitaxial layer stack.

Figure 1C:
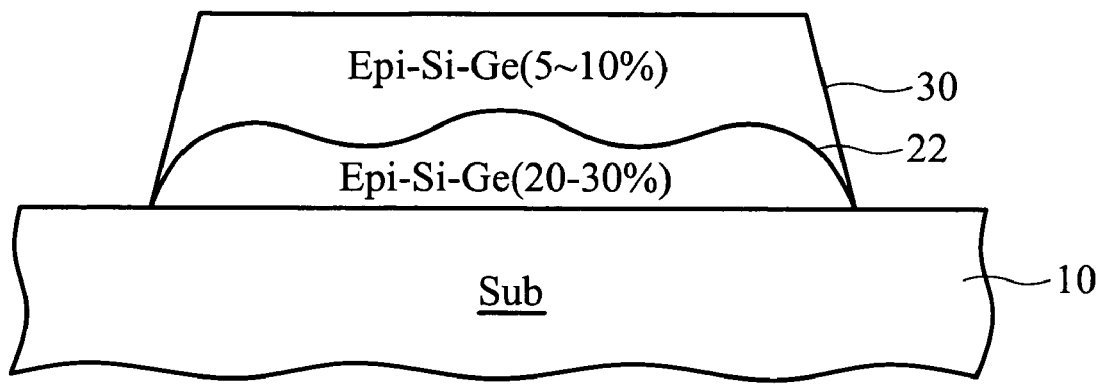

FIG. 1C shows another epitaxial layer stack according to the invention. An epitaxial Si—Ge layer 22 containing 20–30% germanium is formed on a flat substrate 10, e.g. a wafer, a silicon-on-insulator substrate or a semiconductor substrate with a thin silicon layer thereon, with a wavy topography. An epitaxial Si—Ge layer 30 containing 5–10% germanium is then formed on the epitaxial Si—Ge layer 22 containing 20–30% germanium to normalize the overall thickness of the epitaxial layers 22 and 30, thereby providing a flat surface of the epitaxial layer stack.

Figure 1D:
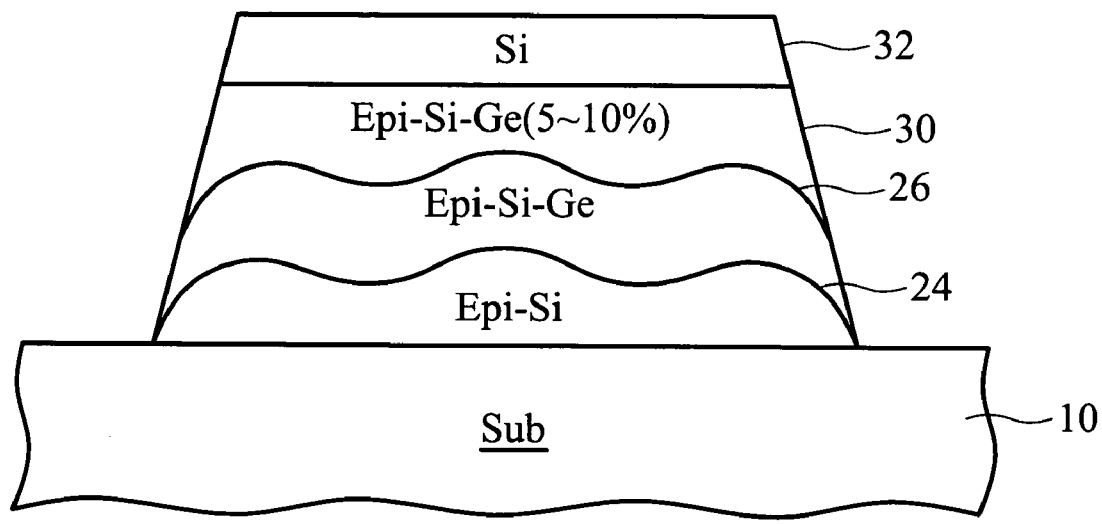

FIG. 1D shows a three-epitaxial-layer stack according to the invention. An epitaxial silicon layer 24 is formed on a flat substrate 10, e.g. a wafer or a silicon-on-insulator substrate, with a wavy topography. An epitaxial Si—Ge layer 26 is then formed on epitaxial silicon layer 24. An epitaxial Si—Ge layer 30 containing 5–10% germanium is then formed on the epitaxial Si—Ge layer 26 to normalize the overall thickness of the epitaxial layers 24, 26 and 30, thereby providing a flat surface of the three-epitaxial-layer stack. An additional silicon layer 32 with a thickness of 50–100 angstrom can be optionally formed on the flat surface of the epitaxial Si—Ge layer 30 containing 5–10% germanium, which is also flat.

Figure 1E:
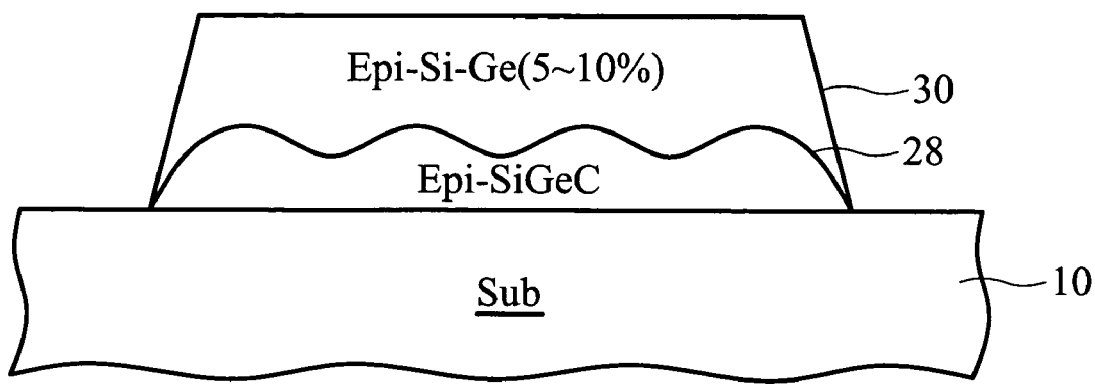

FIG. 1E shows another epitaxial layer stack according to the invention. An epitaxial Si—Ge—C layer 28 is formed on a flat substrate 10, e.g. a wafer or a silicon-on-insulator substrate, with a wavy topography. An epitaxial Si—Ge layer 30 containing 5–10% germanium is then formed on the epitaxial Si—Ge—C layer 28 to normalize the overall thickness of the epitaxial layers 28 and 30, thereby providing a flat surface of the epitaxial layer stack.

Figure 1F:
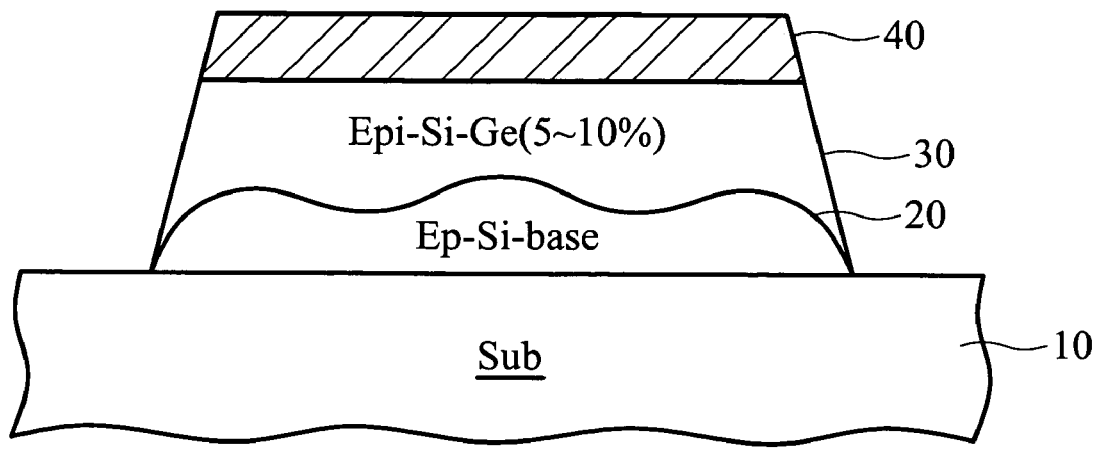

According to the present invention, the epitaxial Si—Ge layer containing 5–10% germanium provides a flat surface for the subsequent process or layer. As shown in FIG. 1F, a wavy epitaxial silicon base layer 20 is formed on a flat substrate 10. An epitaxial Si—Ge layer 30 containing 5–10% germanium is then formed on the wavy epitaxial silicon base layer 20 to normalize the overall thickness of the epitaxial layers 20 and 30, thereby providing a flat surface of the epitaxial layer stack. A refractory metal layer (not shown) may be formed on the epitaxial Si—Ge layer 30 containing 5–10% germanium and silicidation between the refractory metal layer and the epitaxial Si—Ge layer 30 containing 5–10% germanium is then performed to form a flat silicide layer 40 on the surface of epitaxial Si—Ge layer 30.

Figure 2A:
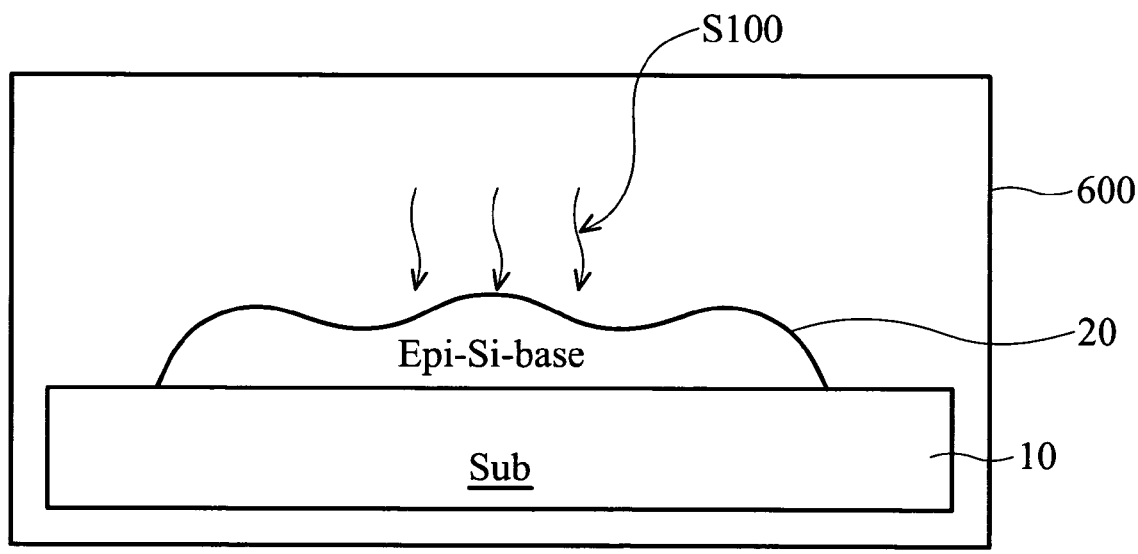
FIGS. 2A to 2B illustrates a method of forming a Si base layer of uniform thickness according to the first embodiment of the present invention.
Figure 2B:
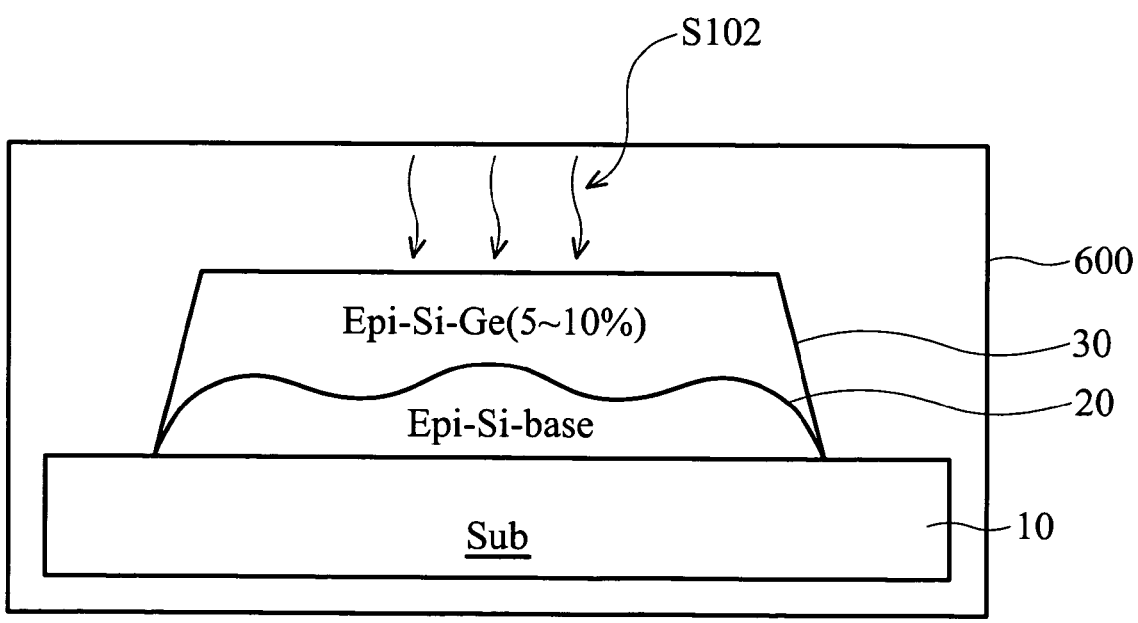

FIGS. 2A to 2B illustrate how to form an epitaxial layer stack as shown in FIG. 1B of uniform thickness according to one embodiment of the present invention. As shown in FIG. 2A, a substrate 10, such as silicon wafer substrate or a silicon-on-insulator (SOI) substrate, is provided inside a chamber 600. The substrate 10 may already contain MOS transistors, resistors, logic devices, or the like thereon, though they are omitted from the drawings for the sake of clarity. In the following, the term "substrate" includes devices formed within a semiconductor wafer and the layers overlying the wafer. The term "substrate surface" includes the uppermost exposed layers on a semiconductor wafer, such as a Si wafer surface, an insulating layer and metal wires. An epitaxy layer described hereinafter may be formed on the surface of the semiconductor substrate 10 for specific application, such as a BiCMOS, a strained channel, or a raised source/drain as is known.

Next, in a first step of epitaxy S100, a precursor containing silicon is preferably introduced into the chamber 600 at 600–900° C. at 0.1–100 torr to form a Si base layer 20 on the semiconductor substrate 10. The precursor containing silicon preferably comprises $SiH_4$, or $SiH_2Cl_2$ (DCS). A carrier gas, such as $H_2$, and an etching gas, such as HCl, are further introduced into the chamber 600 during the first step of epitaxy S100. Flow rates of the precursor containing silicon are preferably about 20–200 sccm, the carrier gas 5–100 slm, and the etching gas 5–200 sccm. As well, the thickness of the resulting epitaxial Si base layer 20 is preferably about 50–500 Å.

In order to improve specific physical or chemical properties of the epitaxy layer, precursors comprising elements from the IVA group of the periodic table, such as carbon and germanium, can be further introduced into the chamber 600 during the first step of epitaxy S100. For example, $Si_{(1-x-y)}Ge_xC_y$ having a lattice mismatch with the silicon substrate 10 and inducing stress therein can be formed when the precursors comprising a Si-containing gas, a Ge-containing gas, and a carbon-containing gas are introduced into the chamber 600 during the first step of epitaxy S100, such that the epitaxial $Si_{(1-x-y)}Ge_xC_y$ is preferably utilized for a strained channel as is known. However, the thickness of the epitaxial Si base layer 20 may be non-uniform, e.g. with a wavy or domed surface, due to the material nature.

As seen in FIG. 2B, in a second step of epitaxy S102, a precursor containing silicon and germanium is introduced into the chamber 600 at 600–900° C. at 0.1–100 torr to form a Si—Ge layer 30 on the Si base layer 20 by epitaxy. Germanium concentration for the precursor containing germanium is adjusted using a small ratio, such that germanium content ratio of the Si—Ge layer 30 is small, preferably about 5–10% and more preferably 5–8%. The precursor containing silicon and germanium may comprise $SiH_4$ or $SiH_2Cl_2$ (DCS), and $GeH_4$. A carrier gas, such as $H_2$, and an etching gas, such as HCl, are preferably further introduced into the chamber 600 during the second step of epitaxy S102. The flow rate of $SiH_4$ or $SiH_2Cl_2$ (DCS) is preferably about 20–200 sccm, and of $GeH_4$ about 20–500 sccm, of the carrier gas preferably about 5–100 slm, and of the etching gas preferably about 5–200 sccm. As well, thickness of the Si—Ge layer 30 is preferably about 50–1000 Å. After forming the extra Si—Ge layer 30 with 5–10% germanium on the non-uniform si base layer 20, the total thickness of the Si base layer 20 and the Si—Ge layer 30 is normalized, with improved surface flatness for various applications.

Figure 3A:
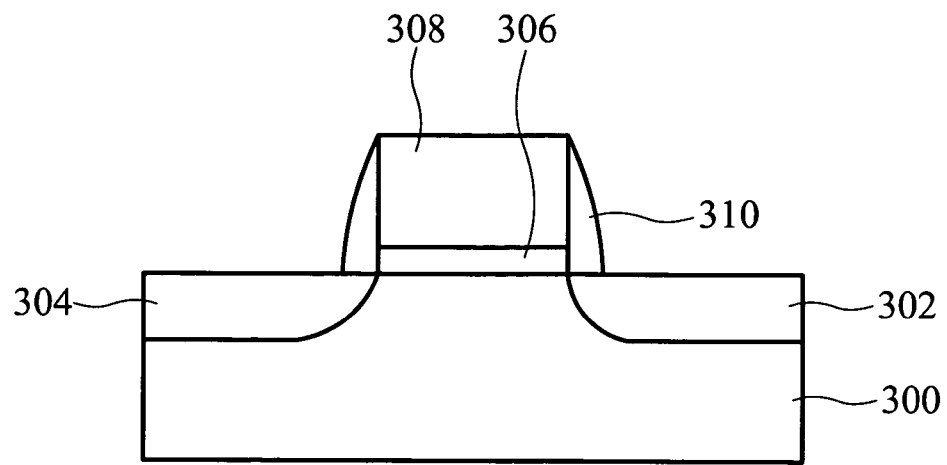
FIGS. 3A through 3C illustrate a method of forming a semiconductor transistor on a conventional wafer according to one embodiment of the present invention.
Figure 3B:
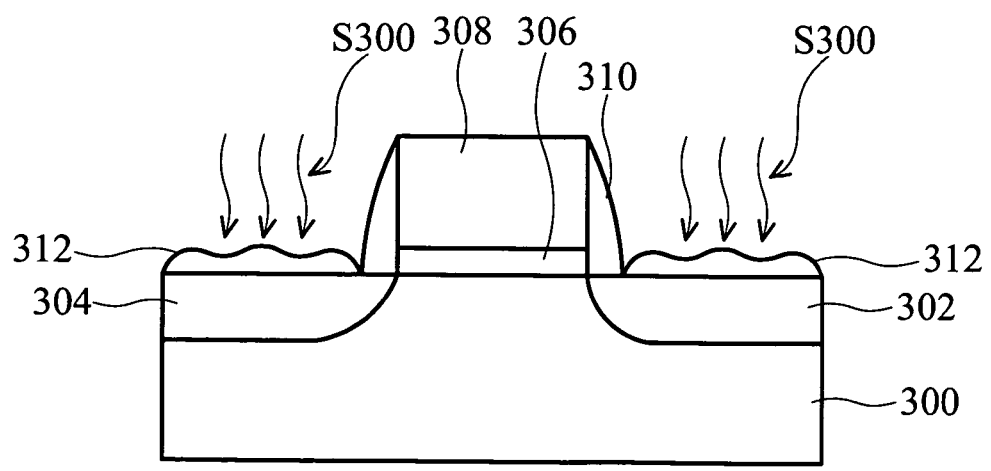
Figure 3C:
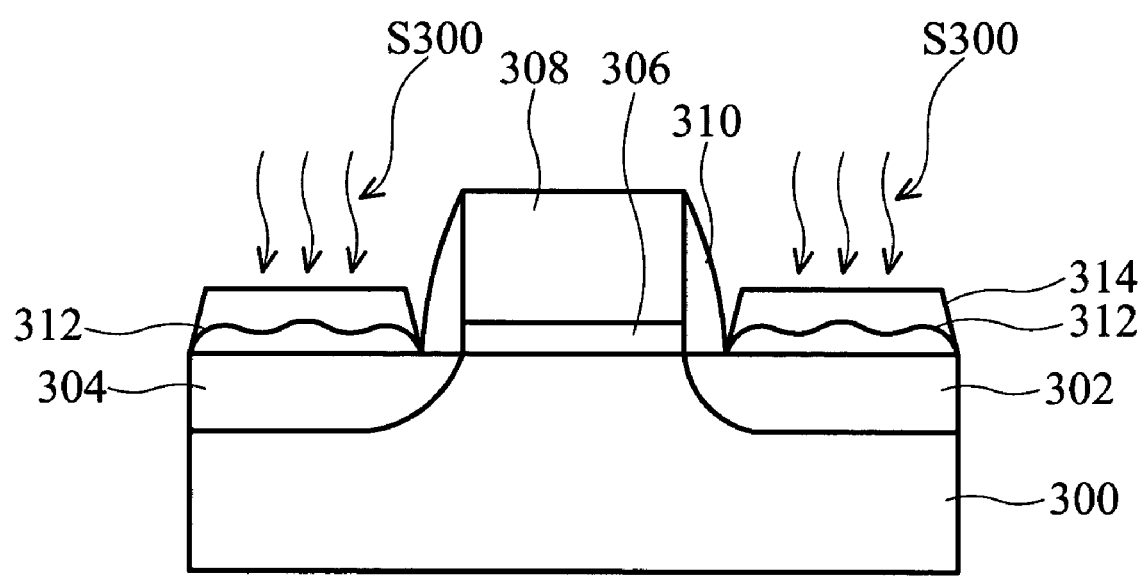

FIGS. 3A through 3C further illustrate a method of forming a semiconductor transistor with raised source and drain of an expitaxial layer according to one embodiment of the present invention.

In FIG. 3A, a semiconductor substrate 300, such as a silicon wafer, is provided inside a chamber (not shown). A gate dielectric layer 306 and a gate layer 308 are subsequently formed on the semiconductor substrate 300 to form a gate body. The semiconductor substrate 300 undergoes ion implantation to form a source extension 302 and a drain extension 304 beside the stacked gate dielectric layer 306 and the gate layer 308. A spacer 310 preferably of nitride is subsequently formed on the sidewall of the stacked gate dielectric layer 306 and the gate layer 308.

As shown in FIG. 3B, in a first step of epitaxy S300, a precursor containing silicon is introduced into the chamber at 600–900° C. at 0.1–100 torr to form a pair of Si base layers 312 individually aligning the source extension 302 and the drain extension 304 on the semiconductor substrate 100 by selective epitaxy growth (SEG). The precursor containing silicon preferably comprises $SiH_4$, or $SiH_2Cl_2$ (DCS). A carrier gas, such as $H_2$, and an etching gas, such as HCl, are further introduced into the chamber during the first step of epitaxy S300. Flow rates of the precursor containing silicon are preferably about 20–200 sccm, the carrier gas 5–100 slm, and the etching gas 5–200 sccm. As well, the thickness of the Si base layer 312 is preferably about 50–500 Å. The Si base layer 312 can further comprise germanium by introducing a precursor containing germanium into the chamber during the first step of epitaxy S300. The amount of germanium content is at least 10%, preferably about 20%. However, the thickness of the epitaxy Si base layer 312 is non-uniform, e.g. with a wavy or domed surface, due to the material nature.

As seen in FIG. 3C, in a second step of epitaxy S302, a precursor containing silicon and germanium is introduced into the chamber at 600–900° C. at 0.1–100 torr to form a pair of Si—Ge layers 314 on the Si base layer 312 by selective epitaxy growth (SEG). Germanium concentration for the precursor containing germanium is adjusted using a small ratio, thereby germanium content ratio of the Si—Ge layer 314 is small, about 5–10% and preferably 5–8%. The precursor containing silicon and germanium preferably comprises $SiH_4$ or $SiH_2Cl_2$ (DCS), and $GeH_4$. A carrier gas, such as $H_2$, and an etching gas, such as HCl, may be further introduced into the chamber during the second step of epitaxy S302. The flow rate of $SiH_4$ or $SiH_2Cl_2$ (DCS) is preferably about 20–200 scam, of $GeH_4$ preferably about 20–300 scam, of the carrier gas preferably about 5–100 slm, and of the etching gas preferably about 5–200 sccm. As well, the thickness of the Si—Ge layer 314 is preferably about 50–1000 Å. After forming the extra epitaxial Si—Ge layer 314 containing 5–10% germanium on the non-uniform si base layer 312, resulting in a raised source and drain on the source extension 302 and the drain extension 304. The total thickness of the Si base layer 312 and the Si—Ge layer 314 is uniform, with improved surface flatness for subsequent ion doping or silicidation.

As a result, the transistor has flat raised source and drain regions for subsequent ion implantation, thereby achieving even depth of ion implantation.

Figure 4:
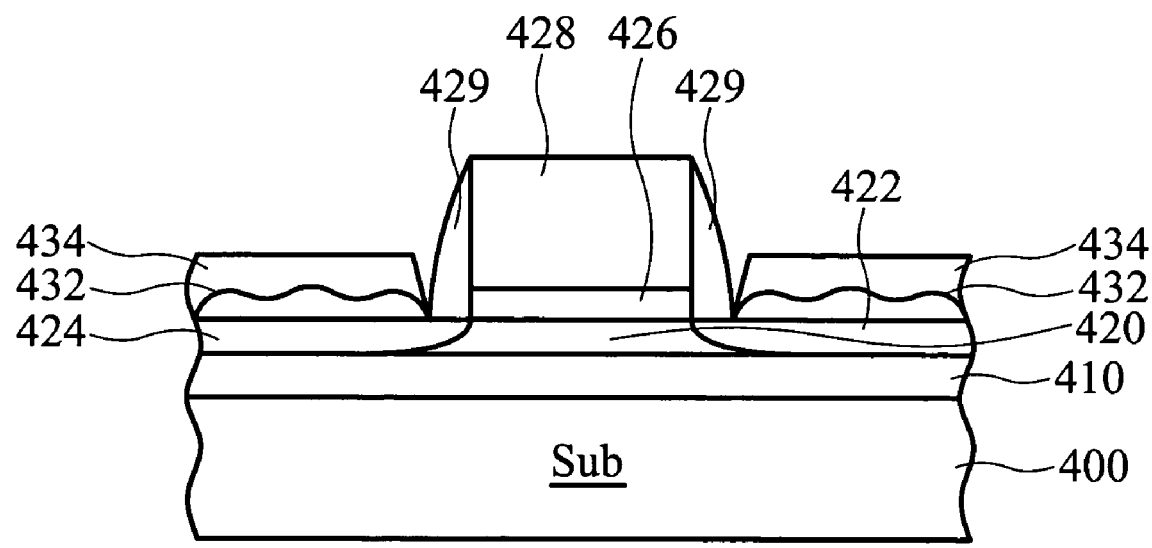
FIG. 4 shows a transistor formed on a silicon-on-insulator substrate according to another embodiment of the invention.

FIG. 4 shows a transistor formed on a silicon-on-insulator substrate according to another embodiment of the invention. As shown in FIG. 4A, a silicon-on insulator (SOI) substrate is provided. An insulator layer 410, e.g. a silicon oxide layer, is disposed over a conventional silicon substrate 400. A thin silicon layer 420 with a thickness about 100 Å is disposed over the insulator layer 410. A semiconductor transistor is then formed on the silicon layer 420 by similar process as described in FIGS. 3A to 3C. A gate dielectric layer 426 and a gate layer 428 are subsequently formed on the silicon layer 420 to form a gate body. The semiconductor substrate 420 undergoes ion implantation to form a shallow source extension 422 and drain extension 424 beside the stacked gate dielectric layer 426 and the gate layer 428. A spacer 429 is subsequently formed on the sidewall of the stacked gate dielectric layer 426 and the gate layer 428. A pair of Si base layers 422 are then individually formed aligning the source extension 422 and the drain extension 424 by selective epitaxy growth (SEG). A pair of Si—Ge layers 434 containing 5–10% germanium are then individually formed on the pair of Si base layers 432 by selective epitaxy growth (SEG), resulting in a raised source and drain on the source extension 422 and the drain extension 424. The total thickness of the Si base layer 432 and the Si—Ge layer 434 containing 5–10% germanium is uniform, with improved surface flatness for subsequent ion doping or silicidation.

It is of note that the raised source and drain regions described no matter in FIG. 3C or FIG. 4 can be further modified as the epitaxial layer stack disclosed in FIGS. 1A to 1F, based the spirit of the claimed invention. The flat and uniform thickness of raised source and drain regions of the transistor in FIG. 3C or 4 benefits the subsequent source and drain implantation with a uniform depth and the following silicidation for source/drain contact.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a Si base layer of uniform thickness, comprising:
   providing a Si base substrate;
   forming a first wavy Si—Ge layer containing more than 20% germanium on the Si base substrate by epitaxy; and
   forming a second Si—Ge layer containing less than 10% germanium on the first wavy Si—Ge layer by epitaxy to normalize an overall thickness of the first wavy Si—Ge layer and the second Si—Ge layer.

2. The method according to claim 1, wherein the second Si—Ge layer is formed containing 5–8% germanium.

3. The method according to claim 1, wherein the first wavy Si—Ge layer comprises carbon.

4. The method according to claim 1, wherein the thickness of the first wavy Si—Ge layer is approximately 50–500 Å and the thickness of the second Si—Ge layer is approximately 50–1000 Å.

5. The method according to claim 1, wherein the first wavy Si—Ge base layer and/or the second Si—Ge layer is formed by selective epitaxy growth (SEG).

6. The method according to claim 5, wherein the second Si—Ge layer is formed by introducing a precursor containing $SiH_2Cl_2$ and $GeH_4$ into a chamber for the epitaxy growth.

7. A method of fabricating a transistor having a raised source and drain with a Si base layer of uniform thickness, said method comprising:
   providing a semiconductor substrate;
   forming a source extension and a drain extension in the substrate;
   forming a gate dielectric layer on the semiconductor substrate;
   forming a gate layer on the gate dielectric layer;
   forming a pair of first wavy Si—Ge layers containing more than 20% germanium by epitaxy to create a raised source and a raised drain on the semiconductor substrate and respectively cover the source and drain extensions; and
   forming a second Si—Ge layer containing less than 10% germanium on the raised source and the raised drain by epitaxy.

8. The method according to claim 7, wherein the second Si—Ge layer is formed containing 5–8% germanium.

9. The method according to claim 7, wherein the first wavy Si—Ge layer comprises at least 10% carbon.

10. The method according to claim 7, further comprising forming a spacer on the sidewalls of the gate layer and the gate dielectric layer before forming the raised source and the raised drain.

11. The method according to claim 7, wherein the thickness of the first wavy Si—Ge layer is about 50–500 Å and the thickness of the second Si—Ge layer is about 50–1000 Å.

12. The method according to claim 1, wherein the first wavy Si—Ge layer contains 20–30% germanium.

\* \* \* \* \*